United States Patent
Ha et al.

(10) Patent No.: US 11,925,034 B2
(45) Date of Patent: Mar. 5, 2024

(54) ELECTRONIC DEVICE AND METHOD FOR FABRICATING THE SAME

(71) Applicant: SK hynix Inc., Icheon-si (KR)

(72) Inventors: Tae Jung Ha, Icheon-si (KR); Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/132,296

(22) Filed: Apr. 7, 2023

(65) Prior Publication Data
US 2023/0247844 A1    Aug. 3, 2023

Related U.S. Application Data

(63) Continuation of application No. 17/204,822, filed on Mar. 17, 2021, now Pat. No. 11,665,912.

(30) Foreign Application Priority Data

Oct. 7, 2020  (KR) .................. 10-2020-0129145

(51) Int. Cl.
| | | |
|---|---|---|
| *G06F 13/40* | (2006.01) | |
| *G06F 9/22* | (2006.01) | |
| *G06F 13/16* | (2006.01) | |
| *G11C 13/00* | (2006.01) | |
| *H10B 63/00* | (2023.01) | |
| *H10N 70/00* | (2023.01) | |

(52) U.S. Cl.
CPC ............. *H10B 63/24* (2023.02); *G06F 9/223* (2013.01); *G06F 13/1668* (2013.01); *G06F 13/4027* (2013.01); *G11C 13/003* (2013.01); *H10B 63/80* (2023.02); *H10N 70/063* (2023.02); *G11C 2213/72* (2013.01)

(58) Field of Classification Search
None
See application file for complete search history.

(56) References Cited

U.S. PATENT DOCUMENTS

| | | | |
|---|---|---|---|
| 9,553,050 B2 * | 1/2017 | Hu | ............ H01L 21/76805 |
| 9,847,478 B2 | 12/2017 | Chang et al. | |
| 2019/0066779 A1 | 2/2019 | Karpov | |
| 2022/0109026 A1 | 4/2022 | Ha et al. | |

FOREIGN PATENT DOCUMENTS

KR    10-2036882    10/2019

* cited by examiner

*Primary Examiner* — Scott C Sun
(74) *Attorney, Agent, or Firm* — Perkins Coie LLP

(57) ABSTRACT

An electronic device may include a semiconductor memory structured to include a plurality of memory cells, wherein each of the plurality of memory cells may comprise: a first electrode layer; a second electrode layer; and a selection element layer disposed between the first electrode layer and the second electrode layer to electrically couple or decouple an electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer.

12 Claims, 14 Drawing Sheets

US 11,925,034 B2

1

ELECTRONIC DEVICE AND METHOD FOR FABRICATING THE SAME

CROSS-REFERENCE TO RELATED APPLICATION

This patent document is a continuation of U.S. patent application Ser. No. 17/204,822, entitled "ELECTRONIC DEVICE AND METHOD FOR FABRICATING THE SAME," filed Mar. 17, 2021, which claims the priority and benefits of Korean Patent Application No. 10-2020-0129145, entitled "METHOD FOR FABRICATING ELECTRONIC DEVICE" and filed on Oct. 7, 2020. The entire contents of the above applications are incorporated by reference as part of the disclosure of this patent document.

TECHNICAL FIELD

The embodiments of the disclosed technology relate to memory devices and their applications in electronic devices or systems.

BACKGROUND

With the recent development of personal computers and mobile devices, there are demands for miniaturized, low-power-consumption, high-performance, multi-functionality, electronic devices that can store information. Examples of such electronic devices include, but are not limited to, memory devices that can store data using specific materials that can have different resistant states according to an applied voltage or current, such as an RRAM (resistive random access memory), a PRAM (phase change random access memory), an FRAM (ferroelectric random access memory), an MRAM (magnetic random access memory), and an E-fuse.

SUMMARY

The embodiments of the disclosed technology in this patent document relate to memory circuits/devices and their applications in electronic devices/systems. The disclosed technology can be used in some implementations to provide an electronic device that includes a semiconductor memory to store data using a variable resistance element that exhibits different resistance states.

In one aspect, an electronic device may include a semiconductor memory structured to include a plurality of memory cells, wherein each of the plurality of memory cells may comprise: a first electrode layer; a second electrode layer; and a selection element layer disposed between the first electrode layer and the second electrode layer to electrically couple or decouple an electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer.

In another aspect, a method for fabricating an electronic device comprising a semiconductor memory including a plurality of memory cells may comprise: forming a first electrode layer over a substrate in each memory cell; forming a selection element layer over the first electrode layer in each memory cell to turn on or off the memory cell;

2 performing a first ion implantation process to implant a dopant into a resultant structure of each memory cell including the first electrode layer and the selection element on the substrate such that a projected range associated with the first ion implementation process corresponds to an interface between the first electrode layer and the selection element layer; and forming a second electrode layer over the selection element layer.

In another aspect, an electronic device may include a semiconductor memory, and the semiconductor memory may include a plurality of memory cells, wherein each of the plurality of memory cells may comprise: a first electrode layer; a second electrode layer; and a selection element layer disposed between the first electrode layer and the second electrode layer, and electrically coupled to the first electrode layer and the second electrode layer, wherein the selection element layer has a dopant concentration which decreases from an interface between the selection element layer and the first electrode layer to an interface between the selection element layer and the second electrode layer.

In another aspect, a method for fabricating an electronic device comprising a semiconductor memory including a plurality of memory cells may comprise: forming a first electrode layer over a substrate; forming a selection element layer over the first electrode layer; performing an ion implantation process (B) using an dopant to a resultant structure such that a projected range (Rp) in the ion implementation process (B) corresponds to an interface between the first electrode layer and the selection element layer; and forming a second electrode layer over the selection element layer.

These and other aspects, implementations and associated advantages are described in greater detail in the drawings, the description and the claims.

DETAILED DESCRIPTION

The technology disclosed in this patent document can be implemented in some embodiments to provide a semiconductor devices that can suppress the formation of undesired interface layers FIGS. 1A to 1D are cross-sectional views illustrating a method for fabricating a semiconductor memory based on an example where an undesirable interface layer 14 formed between a switching element layer 13 and a lower electrode layer 12 is not controlled.

Figure 1A:
FIGS. 1A to 1D are cross-sectional views illustrating a method for fabricating a semiconductor memory based on an example where an undesirable interface layer 14 formed between a switching element layer 13 and a lower electrode layer 12 is not controlled.
Figure 1B:
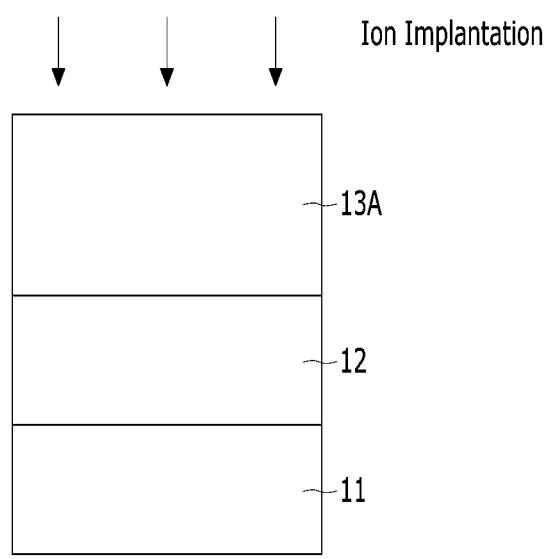
Figure 1C:
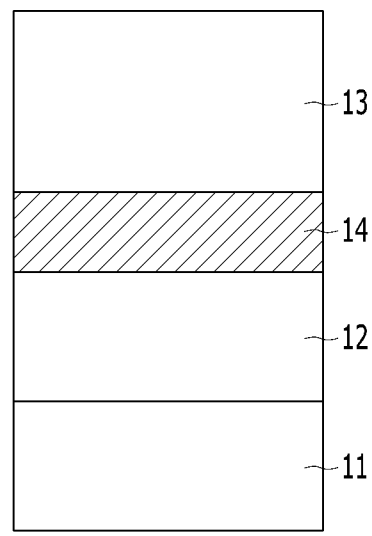
Figure 1D:
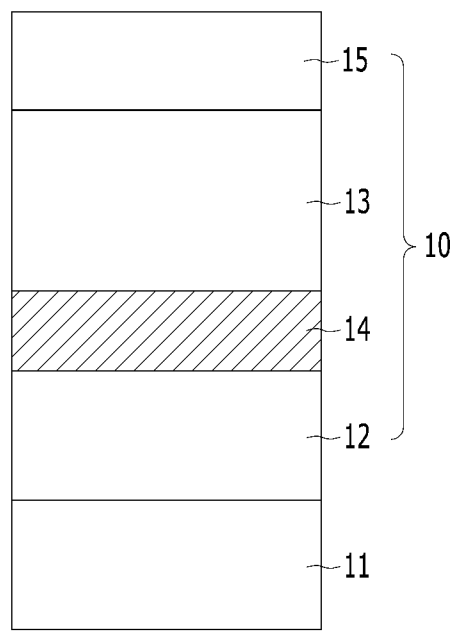

Referring to FIG. 1D, a semiconductor memory may include memory cells 10 formed over a substrate 11.

The memory cells 10 may include a lower electrode layer 12, a switching element layer 13 and an upper electrode layer 15.

The semiconductor memory including the memory cells 10 may have a cross-point memory array structure which is employed in cell regions of highly integrated memory devices. More specifically, the cross-point memory array structure may be included in memory devices such as an RRAM (resistive random access memory), a PRAM (phase change random access memory), an FRAM (ferroelectric random access memory), an MRAM (magnetic random access memory).

Referring to FIG. 1A, a lower electrode layer 12 may be formed over a substrate 11. The lower electrode layer 12 may have a single-layered structure or a multi-layered structure including various conductive materials such as a metal, a metal nitride, a conductive carbon material, or a combination thereof.

Referring to FIG. 1B, a switching element layer 13 may be formed over the lower electrode layer 12.

The switching element layer 13 may be configured to exhibit different states in response to an applied voltage or current to the switching element layer 13 and can be controlled to perform a threshold switching operation in the cross-point semiconductor array structure. For, the switching element layer 13 may a free layer in a magnetic tunneling junction (MTJ) structure which exhibits different magnetization directions and can be controlled to switch between different magnetization directions in response to an applied voltage or current.

The switching element layer 13 may be formed by forming a material layer 13A for the switching element layer 13 and then doping the material layer 13A with dopants by performing an ion implantation process. For example, the material layer 13A may include a silicon oxide, etc., and the dopants may include Cu, etc.

Referring to FIG. 1C, while the switching element layer 13 is formed by forming the material layer 13A and performing the ion implantation process, an undesirable interface layer 14 may be formed at an interface between the switching element layer 13 and the lower electrode layer 12 by a reaction of the switching element layer 13 with the lower electrode layer 12.

Referring to FIG. 1D, an upper electrode layer 15 may be formed over the switching element layer 13. The upper electrode layer 15 may have a single-layered structure or a multi-layered structure including various conductive materials such as a metal, a metal nitride, a conductive carbon material, or a combination thereof.

As such, the method for fabricating the semiconductor memory shown in FIGS. 1A to 1D can create the undesirable interface layer 14 at the interface between the switching element layer 13 and the lower electrode layer 12. When forming the switching element layer 13, the interface layer 14 may be formed at an interface of the switching element layer 13 and the lower electrode layer 12, for example, by inter diffusion or intermixing between the lower electrode layer 12 and the switching element layer 13. The interface layer 14 may include an oxide, a nitride or an oxynitride containing a material included in the lower electrode layer 12. For example, when the lower electrode layer 12 includes TiN, the interface layer 14 may include, for example, $TiO_xN_y$ containing titanium, oxygen and/or nitrogen.

The interface layer 14 formed between the lower electrode layer 12 and the switching element layer 13 causes an unwanted increase in a forming voltage (Vf) that is used for purposes of set/reset operations of the semiconductor memory. A high forming voltage (Vf) can deteriorate the off current (Ioff) characteristics. The off current Ioff can occur at an "off" state of the semiconductor memory, causing sneak or leakage current.

In implementations of the disclosed technology, a semiconductor memory can be formed in a way that improves Vf and Ioff characteristics by efficiently controlling the interface layer that can be generated at an interface between a switching element and a lower electrode during the formation of a switching element.

Figure 2:
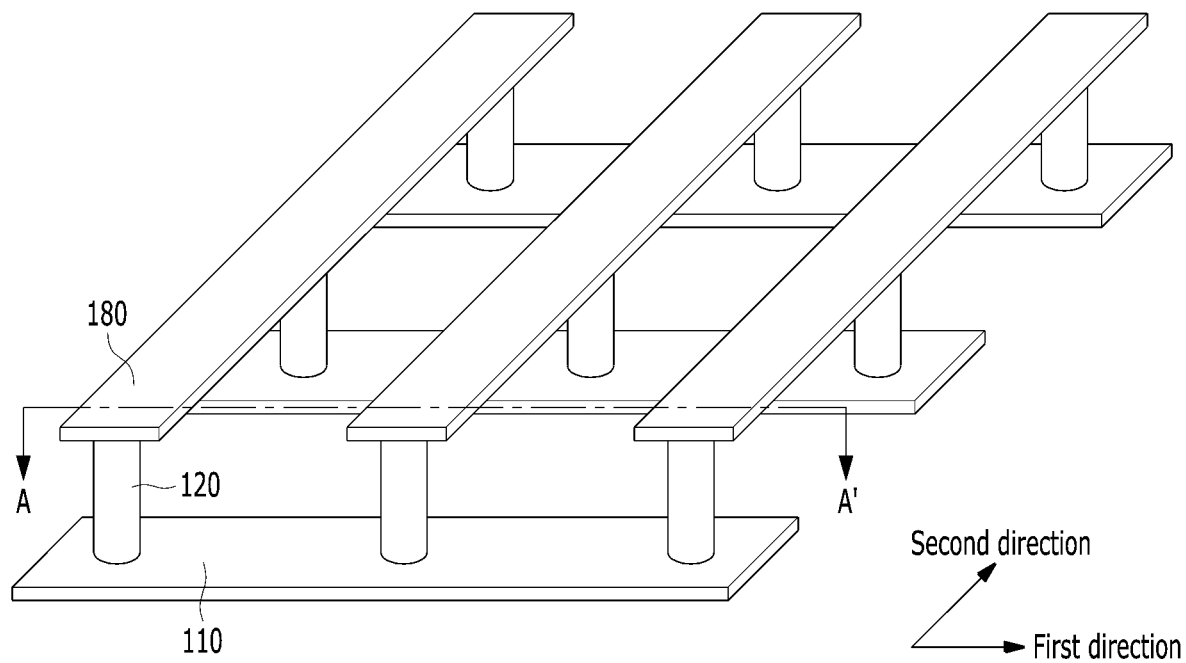
FIG. 2 is a perspective view illustrating an example of a semiconductor memory based on an implementation of the disclosed technology.

FIG. 2 is a perspective view illustrating an example of a semiconductor memory based on an implementation of the disclosed technology.

The semiconductor memory in accordance with the implementation in FIG. 2 of the present disclosure may have a cross-point structure which includes first lines 110 each extending in a first direction, second lines 180 located over the first lines 110 and each extending in a second direction crossing the first direction, and memory cells 120 located between the first lines 110 and the second lines 150. The memory cells 120 are disposed at respective intersections of the first lines 110 and the second lines 180. In this patent document, the term "line" can be used to indicate an interconnect line that is electrically conductive to carry electrical signals.

Figure 3:
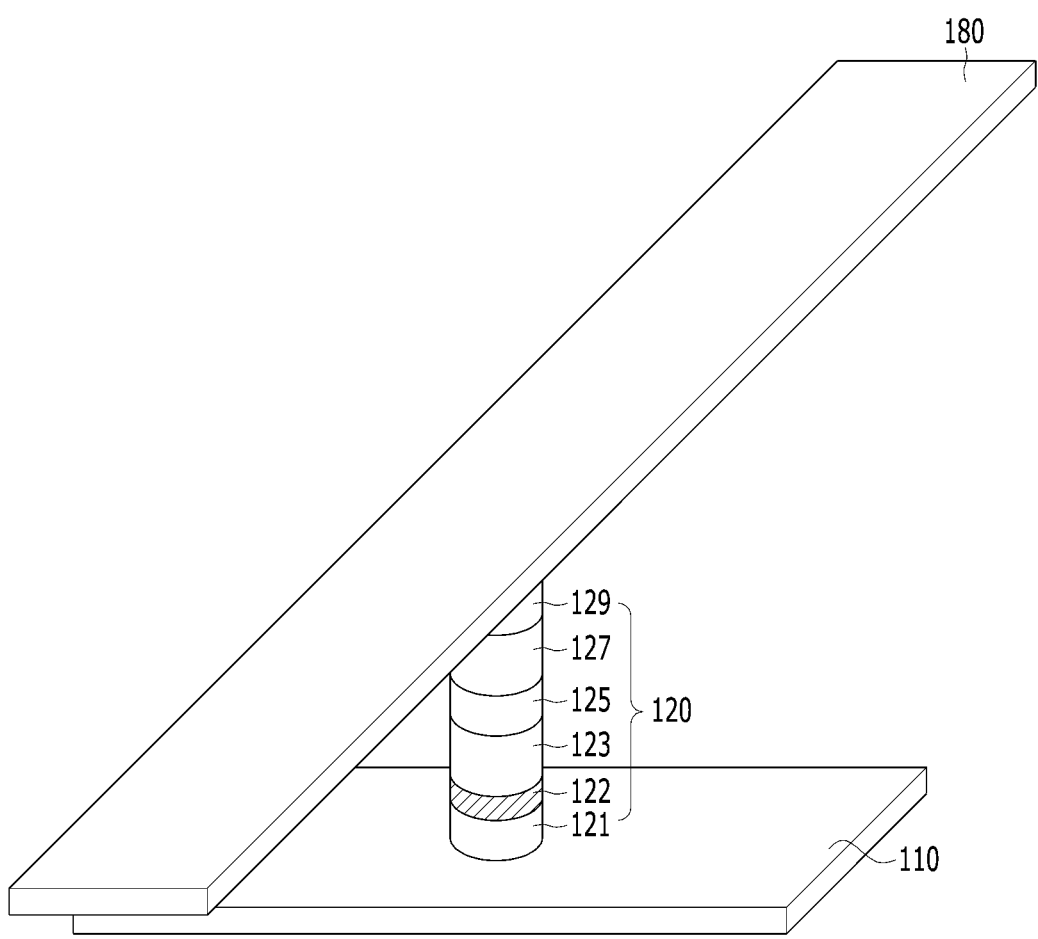
FIG. 3 illustrates an example structure of the semiconductor memory shown in FIG. 2.

FIG. 3 illustrates an example structure of the semiconductor memory shown in FIG. 2.

Referring to FIG. 3, each of the plurality of memory cells 120 may include a lower electrode layer 121, a barrier layer 122, a selection element layer 123, a middle electrode layer 125, a variable resistance layer 127, and an upper electrode layer 129, which are sequentially stacked.

As shown in FIGS. 2 and 3, each of the plurality of memory cells 120 may have a pillar shape. The plurality of memory cells 120 may be arranged in a matrix having rows and columns. The rows each extend along the first direction and the columns extend along a second direction crossing the first direction. The memory cells 120 may be disposed in respective intersection regions between the first lines 110 and second lines 180. In an implementation, each of the memory cells 120 may have a size that is substantially equal to or smaller than that of the intersection region between each corresponding pair of the first lines 110 and the second lines 180. In another implementation, each of the memory cells 120 may have a size that is larger than that of the intersection region between each corresponding pair of the first lines 110 and the second lines 180.

The semiconductor memory in accordance with an implementation of the disclosed technology shown in FIGS. 2 and 3 will be more specifically described with reference to FIGS. 4A to 4I.

FIGS. 4A to 4I are cross-sectional views of the semiconductor device taken along line A-A' of FIG. 2.

FIG. 4A to 4I are cross-sectional views illustrating a method for fabricating a semiconductor memory based on an implementation of the disclosed technology.

Figure 4A:
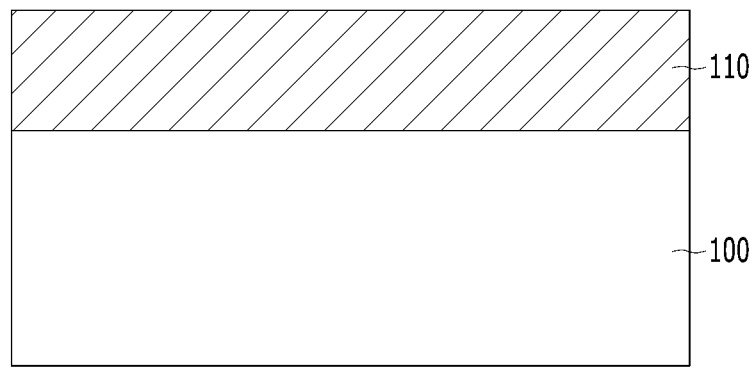
FIG. 4A to 4I are cross-sectional views illustrating a method for fabricating a semiconductor memory based on an implementation of the disclosed technology.

Referring to FIG. 4A, a substrate 100 can include structures (not shown) that are formed before the fabrication processes illustrated in FIGS. 4A-4I. For example, the structures may include one or more transistors for controlling the first lines 110, the second lines 180, or the first and second lines 110 and 180 of FIGS. 2, 3 and 4I, which are formed over the substrate 100.

The first lines 110 each extending in a first direction (e.g., a horizontal direction in FIG. 4A) may be formed over the substrate 100. The first lines 110 may have a single-layered structure or a multi-layered structure, and may include a conductive material such as a metal, a metal nitride, etc. The first lines 110 may be formed by depositing a layer that includes the conductive material and patterning the deposited layer. Spaces between the first lines 110 may be filled with an insulating material (not shown).

Figure 4B:
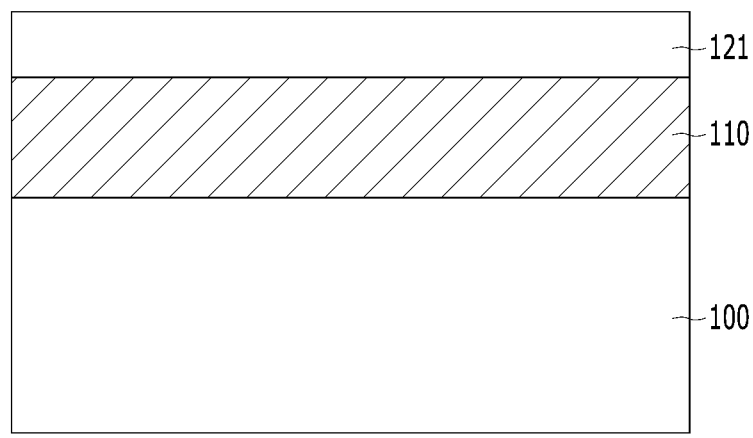

Referring to FIG. 4B, a lower electrode layer 121 may be formed over the first lines 110.

The lower electrode layer 121 may be located at a lowermost portion of each of the memory cells 120 and function as a circuit node that carries a voltage or a current between a corresponding one of the first lines 110 and the remaining portion (e.g., the elements 122, 123, 125, 127, and 129) of each of the memory cells 120.

The lower electrode layer 121 may have a single-layered structure or a multi-layered structure and include a conductive material such as a metal, a metal nitride, a conductive carbon material, etc.

Figure 4C:
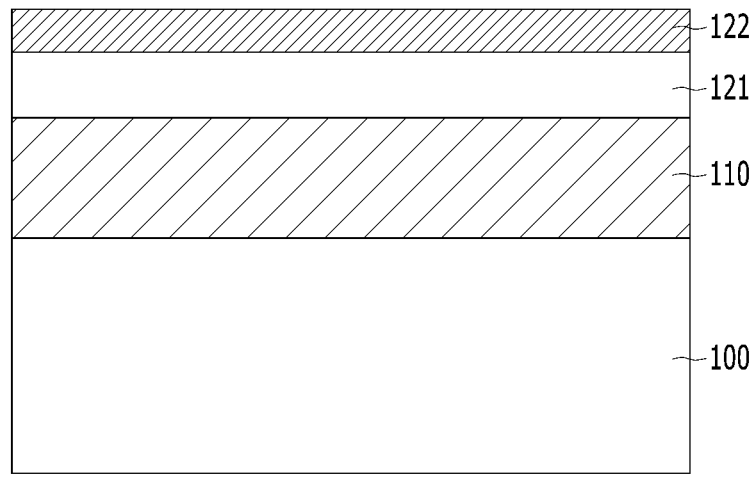

Referring to FIG. 4C, a barrier layer 122 may be formed over the lower electrode layer 121.

The barrier layer 122 may be disposed between the lower electrode layer 121 and a selection element layer 123. The barrier layer 122 can suppress the formation of an undesirable interface layer which is formed by inter diffusion or intermixing between the lower electrode layer 121 and the selection element layer 123, thereby effectively decreasing Vf. The barrier layer 122 can also increase a barrier height as a tunnel barrier effect, thereby effectively decreasing Ioff.

In one implementation, the barrier layer 122 may have a thickness ranging from 5 to 25 angstrom (A). The barrier layer 122 have a small thickness, for example, a thickness of 5-25 Å in order to effectively suppress the formation of the undesirable interface layer, increase the barrier height, and prevent deterioration of device characteristics.

In one implementation, the barrier layer 122 may include one or more materials selected from the group consisting of silicon, an oxide, a nitride, and an oxynitride. For example, the barrier layer 122 may include $Al_2O_3$, $TiO_2$, TaAlON, MgO, $Si_3N_4$, Si, SiON or a similar material.

Figure 4D:
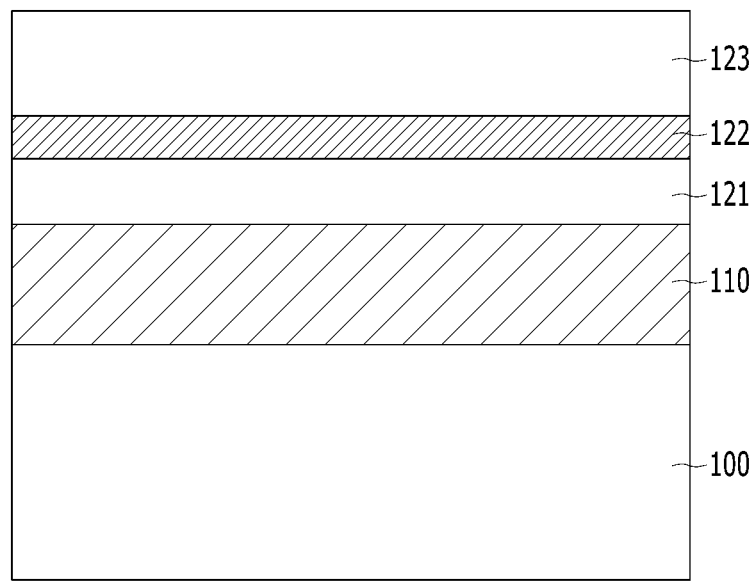

Referring to FIG. 4D, a selection element layer 123 may be formed over the barrier layer 122.

Figure 4E:
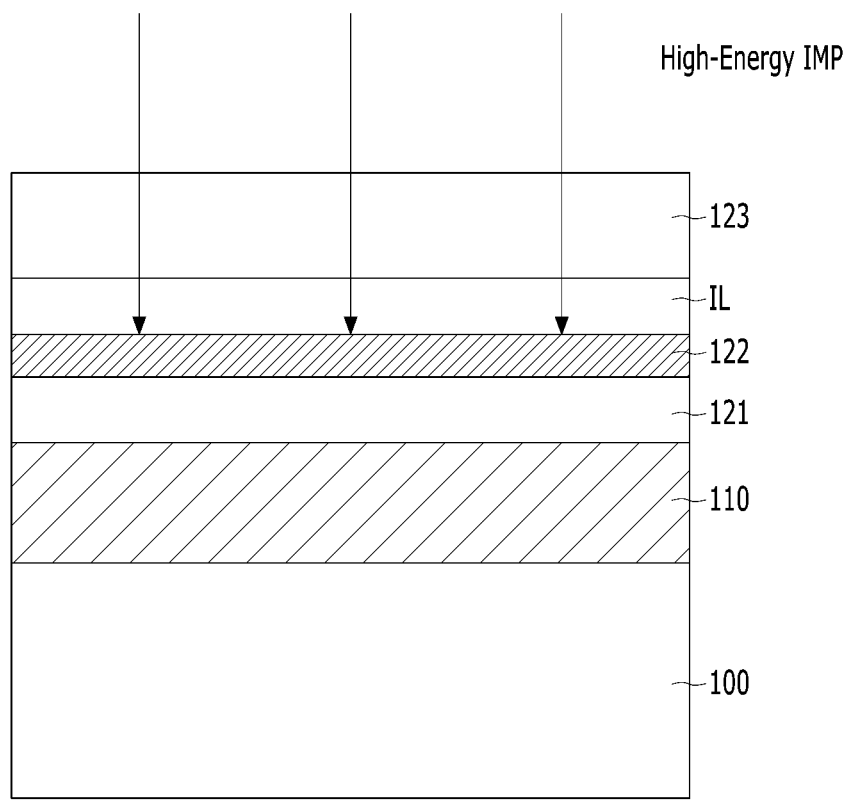
Figure 4F:
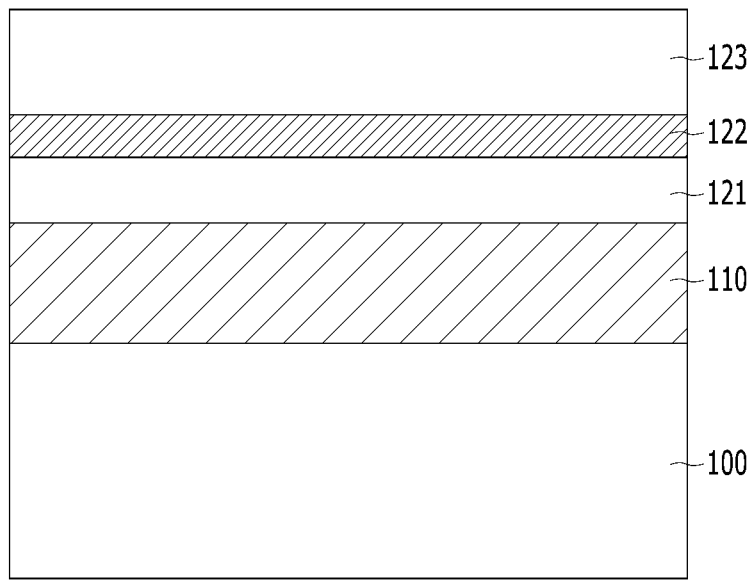
Figure 4G:
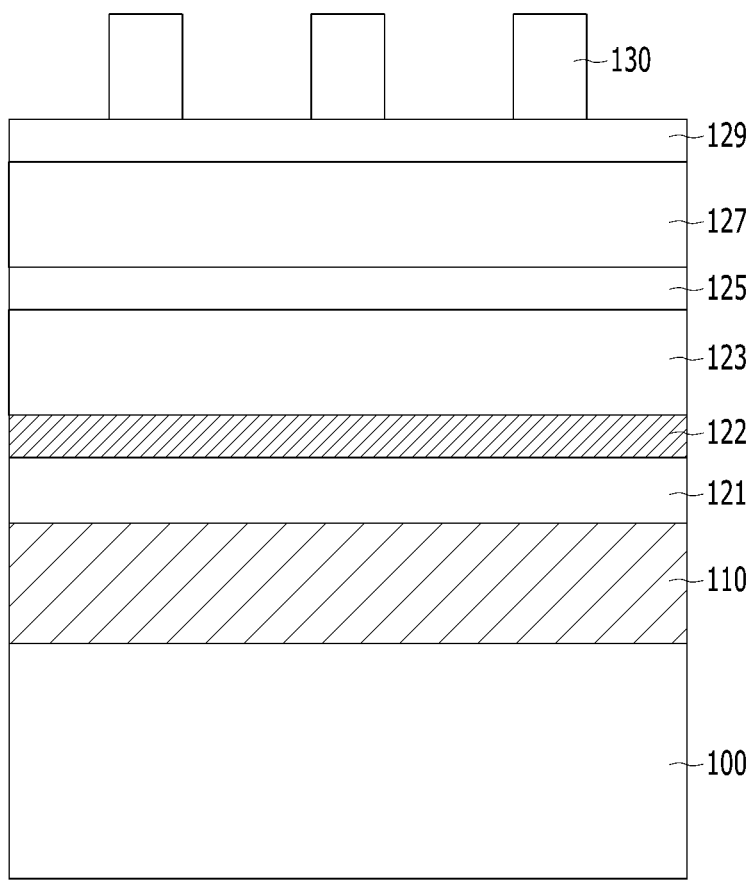
Figure 4H:
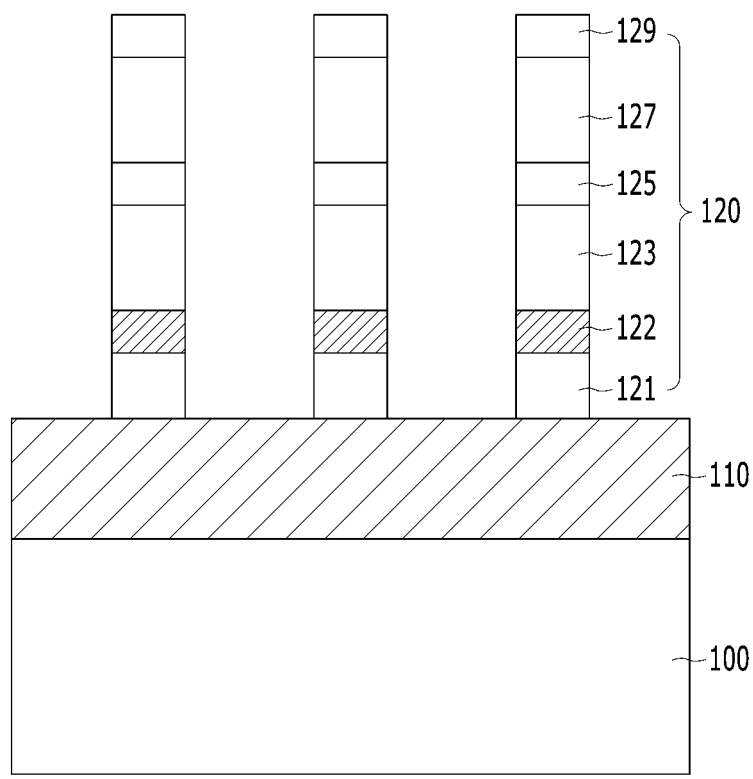
Figure 4I:
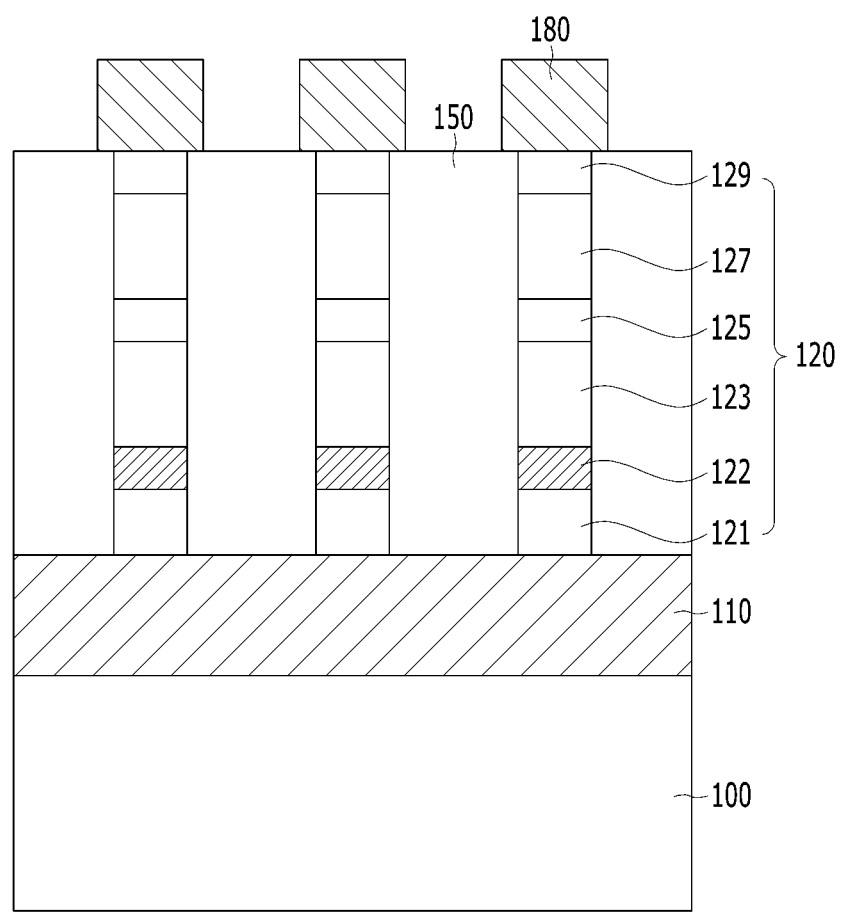

The selection element layer 123 may serve to control access to a variable resistance layer 127 of FIGS. 2, 3 and 4I by turning an electrical path to the variable resistance layer 127 for reading or writing data therein or by turning off the electrical path to the variable resistance layer 127. That is, the selection element layer 123 may function as a switching element to turn off, or de-select a memory cell 120 by preventing a current from passing through the selection element layer 123 when a magnitude of an applied voltage or an applied current is lower than a threshold value, and turn on or select a memory cell 120 by allowing a current to pass through the selection element layer 123 when a magnitude of the applied voltage or the applied current is substantially equal to or greater than the threshold value. For example, a magnitude of the current passing through the selection element layer 123 is proportional to a magnitude of the voltage or current applied to the selection element layer 123. The selection element layer 123 may have a single-layered structure, or a multi-layered structure that exhibits the selection element characteristic using a combination of two or more layers.

In some implementations, the selection element layer 123 may include: an MIT (metal insulator transition) element, such as $NbO_2$ or $TiO_2$; an MIEC (mixed ion-electron conducting) element, such as $ZrO_2$ ($Y_2O_3$), $Bi_2O_3$—BaO, or $(La_2O_3)_x(CeO_2)_{1-x}$; an OTS (ovonic threshold switching) element including a chalcogenide-based material, such as $Ge_2Sb_2Te_5$, $As_2Te_3$, $As_2$, $As_2Se_3$; or a combination thereof.

In certain implementations, the selection element layer 123 may include a tunneling dielectric layer. The tunneling dielectric layer includes one or more of various dielectric materials, such as a silicon oxide, a silicon nitride, and a metal oxide. A thickness of the tunneling dielectric layer is sufficiently small to allow tunneling of electrons under a given voltage or a given current.

In one implementation, the selection element layer 123 may be configured to perform a threshold switching operation. In this patent document, the term "threshold switching operation" can be used to indicate turning on or off the selection element layer 123 while an external voltage is applied to the selection element layer 123. In such a case, an absolute value of the external voltage may gradually increase or decrease. When the absolute value of the external voltage applied to the selection element layer 123 increases, the selection element layer 123 may be turned on, thereby causing an operation current to nonlinearly increase when the absolute value of the external voltage is greater than a first threshold voltage. When the absolute value of the external voltage applied to the selection element layer 123 decreases after the selection element layer 123 is turned on, the selection element layer 123 may be turned off, thereby causing the operation current to nonlinearly decrease when the absolute value of the external voltage is less than a second threshold voltage. As such, the selection element layer 123 performing the threshold switching operation may have a non-memory operation characteristic.

In one implementation, the selection element layer 123 may be formed by forming a material layer for the selection element layer 123 and doping the material layer with dopants.

The material layer for the selection element layer 123 may include an insulating material such as a silicon oxide, a silicon nitride, a metal oxide, a metal nitride, or a combination thereof.

The dopants doped into the material layer for the selection element layer 123 may include n-type dopants or p-type dopants. The dopants may be formed in the material layer by an ion implantation process.

The dopants doped into the material layer for the selection element layer 123 may include, for example, one or more of B, N, C, P, As, Al, Si or Ge.

The selection element layer 123 may perform a threshold switching operation through a doping region formed in the material layer for the selection element layer 123. Thus, a size of the threshold switching operation region may be controlled by a distribution area of the dopants. The dopants may form trap sites for charge carriers in the material layer for the selection element layer 123. The trap sites may capture the charge carriers moving in the selection element layer 123 between a middle electrode layer (e.g., numerical reference 125 in FIGS. 2, 3 and 4i) and an upper electrode layer (e.g., numerical reference 129 in FIGS. 2, 3 and 4i), based on an external voltage applied to the selection element layer 123. The trap sites thereby provide a threshold switching characteristic and are used to perform a threshold switching operation.

When the selection element layer 123 is formed by forming the material layer for the selection element layer 123 and doping the material layer with dopants, an undesirable interface layer may be formed due to inter diffusion or intermixing of the lower electrode layer 121 and the selection element layer 123. As described above, the disclosed technology can be implemented in some embodiments to suppress the formation of the undesirable interface layer by forming the barrier layer 122 between the lower electrode layer 121 and the selection element layer 123.

In some implementations, in addition to or in lieu of the formation of the barrier layer 122, the formation of the undesirable interface layer can be suppressed through a high-energy ion implantation process as will be discussed below. In some cases, the barrier layer 122 may be insufficient to completely block inter diffusion or intermixing of the lower electrode layer 121 and the selection element layer 123, and thus an undesirable interface layer (e.g., numerical reference IL of FIG. 4E) may be formed at a lower interface of the selection element layer 123, i.e., at an interface of the barrier layer 122 and selection element layer 123.

The interface layer IL may include an oxide, a nitride or an oxynitride that includes the same material as the one that is included in the lower electrode layer 121. For example, when the lower electrode layer 121 includes TiN, the interface layer IL may include titanium, oxygen and/or nitrogen, for example, $TiO_xN_y$.

Referring to FIG. 4E, in some implementations, the formation of the interface layer IL can be effectively controlled by breaking the bonding of the interface layer IL through a high-energy ion implantation process (high-energy IMP). In this way, at least a portion of the interface layer IL may be removed by the high-energy ion implantation process.

The high-energy ion implantation process may be performed by adjusting the projected range (Rp) of the implanted ions to a depth at which a lower interface of the selection element layer 123 is located.

In one implementation, when the barrier layer 122 does not exist, the projected range in the high-energy ion implantation process may correspond to an interface between the lower electrode layer 121 and the selection element layer 123. In one example, the high-energy ion implantation process can break the bonding of the materials in the undesirable interface layer IL formed at an interface between the lower electrode layer 121 and the selection element layer 123 by setting the projected range at an interface between the lower electrode layer 121 and the selection element layer.

In another implementation, when the barrier layer 122 exists, the projected range in the high-energy ion implantation process may correspond to an interface between the barrier layer 122 and the selection element layer 123. In one example, the high-energy ion implantation process can break the bonding of materials in the undesirable interface layer IL formed at an interface between the barrier layer 122 and the selection element layer 123 by setting the projected range an interface between the barrier layer 122 and the selection element layer 123.

As such, in order to effectively control the formation of the undesirable interface layer IL which may be inevitably formed at a lower interface of the selection element layer 123, the high-energy ion implantation process with the projected range adjusted to a depth at which a lower interface of the selection element layer 123 is located can be performed. Accordingly, the bonding of the interface layer IL can be broken, thus effectively decreasing Vf and improving device characteristics.

The dopants that are used in the high-energy ion implantation process may include one or more of B, N, C, P, As, Al, Si or Ge.

The high-energy ion implantation process for controlling the formation of the interface layer IL may be performed with a higher energy than that of the ion implantation process that is performed to form the selection element layer 123 as described above.

In one implementation, the dopants that are used in the high-energy ion implantation process for controlling the formation of the interface layer IL may be the same as those used in the ion implantation process that is performed to form the selection element layer 123 as described above.

In another implementation, the dopants used in the high-energy ion implantation process for controlling the formation of the interface layer IL may be different from those used in the ion implantation process that is performed to form the selection element layer 123 as described above.

Referring to FIG. 4F, the bonding of the undesirable interface layer IL formed at a lower interface of the selection element layer 123 can be broken by the high-energy ion implantation process so that the interface layer IL can be effectively controlled.

As such, in some implementations, after forming the selection element layer 123 by forming the material layer for the selection element layer 123 and then doping the material layer with dopants, the high-energy ion implantation process with the projected range adjusted to a depth at which a lower interface of the selection element layer 123 is located may be performed. Therefore, the selection element layer 123 may have a doping concentration profile which decreases from the bottom toward the top of the selection element layer 123. That is, a lower portion of the selection element layer 123 may have a higher dopant concentration than an upper portion of the selection element layer 123.

In some implementations, the selection element layer 123 may include the dopants introduced by a two-step ion implantation process, that is, a first ion implantation process that is performed when the selection element layer 123 is formed, and a subsequent high-energy ion implantation process that is performed after completion of the first ion implantation process. In one implementation, the dopants introduced by each of the ion implantation processes (the first ion implantation process and the subsequent ion implantation process) may be the same as each other. In another implementation, the dopants introduced by the first ion implantation process may be different from the dopants introduced by the subsequent ion implantation process.

Referring to FIG. 4G, a middle electrode layer 125, a variable resistance layer 127 and an upper electrode layer 129 may be sequentially formed over the selection element layer 123.

The middle electrode layer 125 may physically separate the selection element layer 123 from the variable resistance layer 127, and electrically couple the selection element layer 123 to the variable resistance layer 127.

The middle electrode layer 125 may have a single-layered structure or a multi-layered structure and include a conductive material such as a metal, a metal nitride, a conductive carbon material, etc.

The variable resistance layer 127 may switch between different resistance states based on a voltage or a current applied to the variable resistance layer 127 through the upper electrode layer 129 and the middle electrode layer 125, thereby storing data having different values. For example, when the variable resistance layer 127 is in a low resistance state, data having a first logic value of '1' may be stored in the variable resistance layer 127. On the other hand, when the variable resistance layer 127 is in a high resistance state, data having a second logic value of '0' may be stored in the variable resistance layer 127. The variable resistance layer 127 may include one or more materials that can be used in RRAM, PRAM, FRAM, MRAM, or similar memory devices. For example, the variable resistance layer 127 may include one or more of: metal oxides, such as transition metal oxides or perovskite-based materials; phase-change materials, such as chalcogenide-based materials; and ferroelectric materials, ferromagnetic materials. The variable resistance layer 127 may have a single-layered structure, or a multi-layered structure that shows a variable resistance characteristic by a combination of two or more layers. However, other implementations are also possible. For example, the memory cell 120 may include a memory layer that can store data in different ways than the above-described variable resistance layer 127.

The upper electrode layer 129 may be located at an uppermost portion of the memory cells 120 and function as a transmission path of a voltage or a current between the rest of the memory cell 120 and a corresponding one of the second lines 180 of FIGS. 2, 3 and 4I. The upper electrode layer 129 may have a single-layered structure or a multi-layered structure and include a conductive material such as a metal, a metal nitride, a conductive carbon material, etc.

A hard mask pattern 130 may be formed over the upper electrode layer 129.

The hard mask pattern 130 may be formed by forming a material layer for the hard mask pattern 130 and a photoresist pattern (not shown) and etching the material layer by using the photoresist pattern as an etch barrier. The hard mask patterns 130 may function as an etching barrier during the etching process of the material layers for forming the memory cells 120. The hard mask patterns 130 may include one or more materials that can be used to secure the etch selectivity with respect to the memory cells 120. For example, each of the hard mask patterns 130 may have a single-layered structure or a multi-layered structure and include an insulating material such as a silicon oxide, a silicon nitride, a silicon oxynitride, etc.

Referring to FIG. 4H, the memory cells 120 may be formed by sequentially etching the upper electrode layer 129, the variable resistance layer 127, the middle electrode layer 125, the selection element layer 123, the barrier layer 122 and the lower electrode layer 121 by using the hard mask pattern 130 as an etch barrier.

In an implementation, the hard mask pattern 130 is removed during the etching process of the memory cells 120. In another implementation, part, or all, of the hard mask pattern 130 may remain during etching the memory cells 120 and then may be removed by the subsequent planarization process.

Referring to FIG. 4I, an interlayer dielectric layer 150 may be formed over the memory cells 120. The interlayer dielectric layer 150 may be formed to have a thickness such that the interface dielectric layer 150 fills spaces between the memory cells 120 and covers a top of the memory cells 120. The interlayer dielectric layer 150 may have a single-layered structure or a multi-layered structure including various insulating material such as a silicon oxide, a silicon nitride, or a combination thereof.

A planarization process such as a CMP (Chemical Mechanical Polishing) process may be performed until a top surface of the memory cells 120 is exposed. Even if the hard mask pattern 130 is not completely removed during the etching process of the memory cells 120 as described above, the planarization process is performed until the top surface of the memory cells 120 is exposed so that the remaining hard mask pattern 130 may be removed in this process.

A plurality of second lines 180 may be formed over the memory cells 120 and the interlayer dielectric layer 150. The plurality of second lines 180 may be respectively coupled to the upper surface of the memory cells 120. Each of the plurality of second lines 180 extends in the second direction crossing the first direction. For example, the second direction may be perpendicular to the line A-A' of FIG. 2. The second lines 180 may have a single-layer structure or a multi-layer structure and include a conductive material, such as a metal or a metal nitride The second lines 180 may be formed by depositing a conductive material and patterning the deposited material. Spaces between the second lines 180 may be filled with an insulating material (not shown).

Through the processes as described above, the semiconductor memory shown in FIGS. 2, 3 and 4I may be fabricated.

Referring to FIGS. 2, 3 and 4I, the semiconductor memory may include the memory cells 120 disposed at intersection regions between the first lines 110 each extending in the first direction and the second lines 180 each extending in the second direction.

In some implementations, the undesirable interface layer which may be inevitably formed at the lower interface of the selection element layer 123 during the formation of the selection element layer 123 can be controlled by the barrier layer 122 formed at an interface of the lower electrode layer 121 and the selection element layer 123. In some implementations, the high-energy ion implantation process may also be performed based on the projected range adjusted to a depth at which a lower interface of the selection element layer 123 is located. As a result, a Vf characteristic and an Ioff characteristic can be effectively improved.

In some implementations, the selection element layer 123 may have a doping concentration profile which decreases from the bottom toward the top of the selection element layer 123. That is, a lower portion of the selection element layer 123 may have a higher dopant concentration than the upper portion of the selection element layer 123. The selection element layer 123 may include the dopants introduced by two-step ion implantation processes, that is, the dopants introduced by the ion implantation process performed in the step of forming the selection element layer 123 and the dopants introduced by the subsequent high-energy ion implantation process. In one implementation, the dopants introduced by each of the ion implantation processes may be the same as each other. In another implementation, the dopants introduced by each of the ion implantation processes may be different from each other.

The barrier layer 122 may have a thickness ranging from 5 to 25 Å, and include one or more materials selected from the group consisting of silicon, an oxide, a nitride, and an oxynitride. For example, the barrier layer 122 may include $Al_2O_3$, $TiO_2$, TaAlON, MgO, $Si_3N_4$, Si, SiON, and similar materials.

In some implementations, each of the memory cells 120 includes the lower electrode layer 121, the barrier layer 122, the selection element layer 123, the middle electrode layer 125, the variable resistance layer 127, and the upper electrode layer 129. However, the memory cells 120 may have different structures. In some implementations, at least one of the lower electrode layer 121, the middle electrode layer 125, and the upper electrode layer 129 may be omitted. In some implementations, the selection element layer 123 may be omitted. In some implementations, the selection element layer 123 and the variable resistance layer 127 may be stacked in a different order. For example, the selection element layer 123 and the variable resistance layer 127 may be stacked in reverse order with respect to the orientation shown in FIGS. 3 and 4I, such that the selection element layer 123 may be disposed over the variable resistance layer 127. In some implementations, in addition to the layers 121, 123, 125, 127, and 129 shown in FIGS. 3 and 4I, the memory cells 120 may further include one or more layers (not shown) for enhancing characteristics of the memory cells 120 or improving fabricating processes.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (i.e., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

The memory cells 120 may store data having different values according to the voltage or current that is applied thereto through the first lines 110 and the second lines 180. In some implementations, when the memory cells 120 include variable resistance elements, each of the memory cells 120 may store data by switching between different resistance states.

One of the first lines 110 may function as a word line and one of the second lines 180 may function as a bit line, or vice versa.

Although one cross-point structure has been described, two or more cross-point structures may be stacked in a vertical direction perpendicular to a top surface of the substrate 100.

The above and other memory circuits or semiconductor devices based on the disclosed technology can be used in a range of devices or systems. FIGS. 5-8 provide some examples of devices or systems that can implement the memory circuits disclosed herein.

Figure 5:
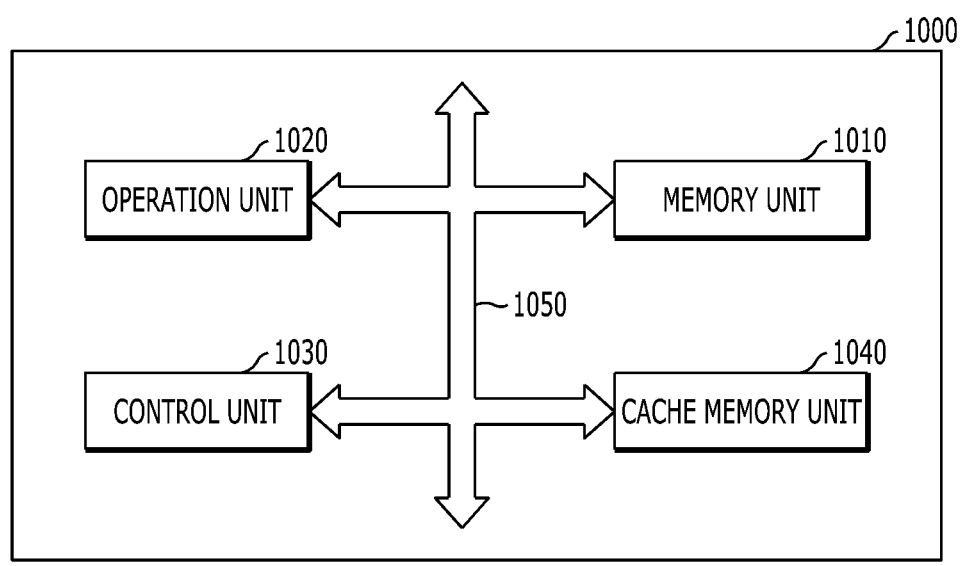
FIG. 5 illustrates an example configuration of a microprocessor that includes memory circuitry based on an implementation of the disclosed technology.

FIG. 5 illustrates an example of configuration of a microprocessor that includes memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first electrode layer; a second electrode layer; and a selection element layer disposed between the first electrode layer and the second electrode layer to electrically couple or decouple an electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer. Through this, when forming the memory unit 1010, the formation of an undesired interface layer can be suppressed, and/or the formed interface layer can be controlled, thereby effectively decreasing Vf, increasing a barrier height and effectively decreasing Ioff. As a consequence, it is possible to improve an electrical characteristic and an operational characteristic and secure reliability of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
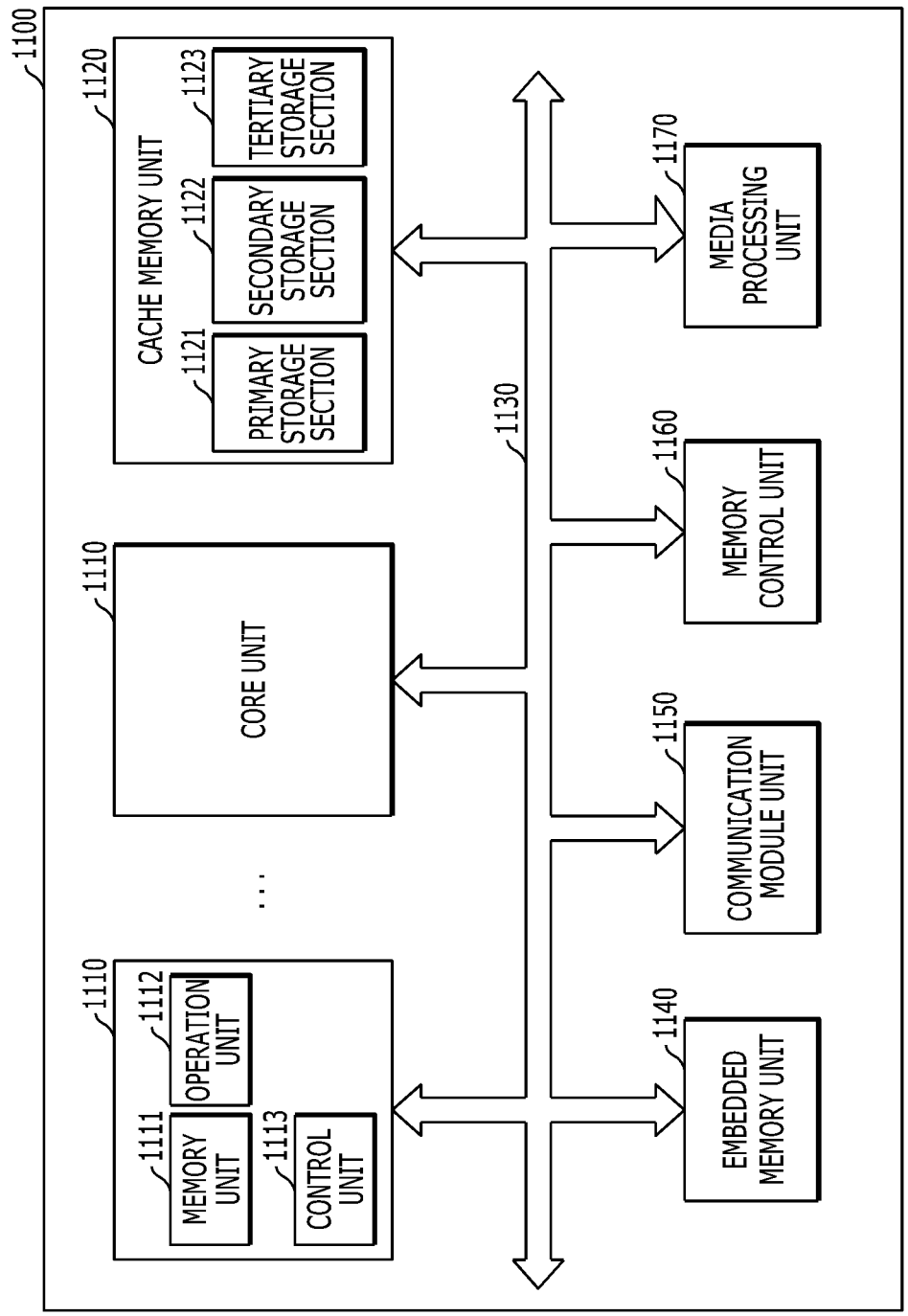
FIG. 6 illustrates an example configuration of a processor that includes memory circuitry based on an implementation of the disclosed technology.

FIG. 6 illustrates an example of configuration of a processor that includes memory circuitry based on the disclosed technology.

Referring to FIG. 6, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1 lower electrode layer 121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first electrode layer; a second electrode layer; and a selection element layer disposed between the first electrode layer and the second electrode layer to electrically couple or decouple an electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer. Through this, when forming the cache memory unit 1120, the formation of an undesired interface layer can be suppressed, and/or the formed interface layer can be controlled, thereby effectively decreasing Vf, increasing a barrier height and effectively decreasing Ioff. As a consequence, it is possible to improve an electrical characteristic and an operational characteristic and secure reliability of the processor 1100.

Although it was shown in this implementation that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
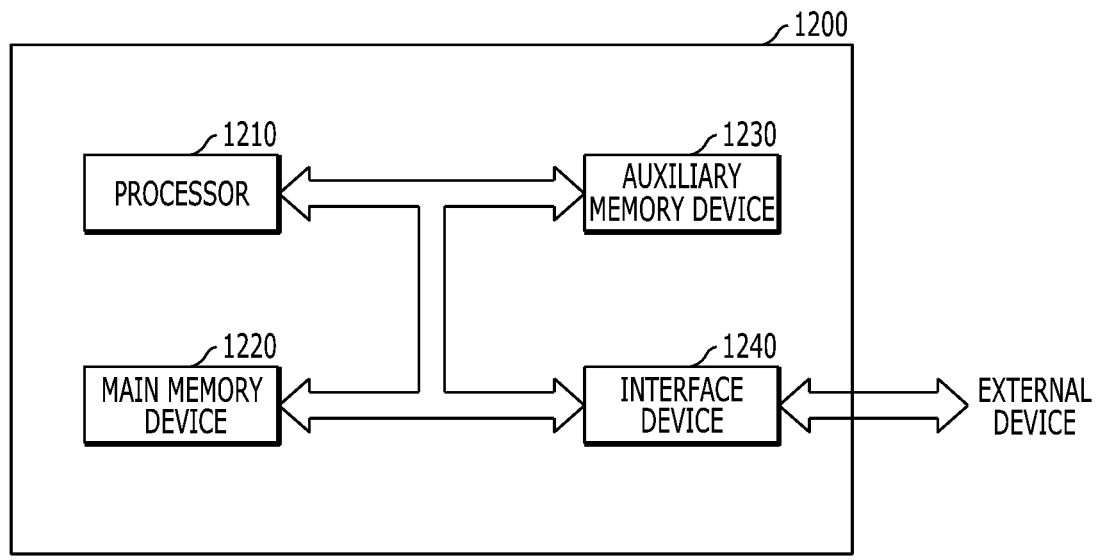
FIG. 7 illustrates an example configuration of a system that includes memory circuitry based on an implementation of the disclosed technology.

FIG. 7 illustrates an example of configuration of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor lower electrode layer 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor lower electrode layer 1210 may decode inputted commands and processes operation, comparison, etc. for the data stored in the system 1200, and controls these operations. The processor lower electrode layer 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the implementations. For example, the main memory device 1220 or the auxiliary memory device 1230 may include a first electrode layer; a second electrode layer; and a selection element layer disposed between the first electrode layer and the second electrode layer to electrically couple or decouple an electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer. Through this, when forming the main memory device 1220 or the auxiliary memory device 1230, the formation of an undesired interface layer can be suppressed, and/or the formed interface layer can be controlled, thereby effectively decreasing Vf, increasing a barrier height and effectively decreasing Ioff. As a consequence, it is possible to improve an electrical characteristic and an operational characteristic and secure reliability of the system 1200.

Also, the main memory device 1220 or the auxiliary memory device 1230 may include a memory system (see the reference numeral 1300 of FIG. 8) in addition to the above-described semiconductor device or without including the above-described semiconductor device.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 8:
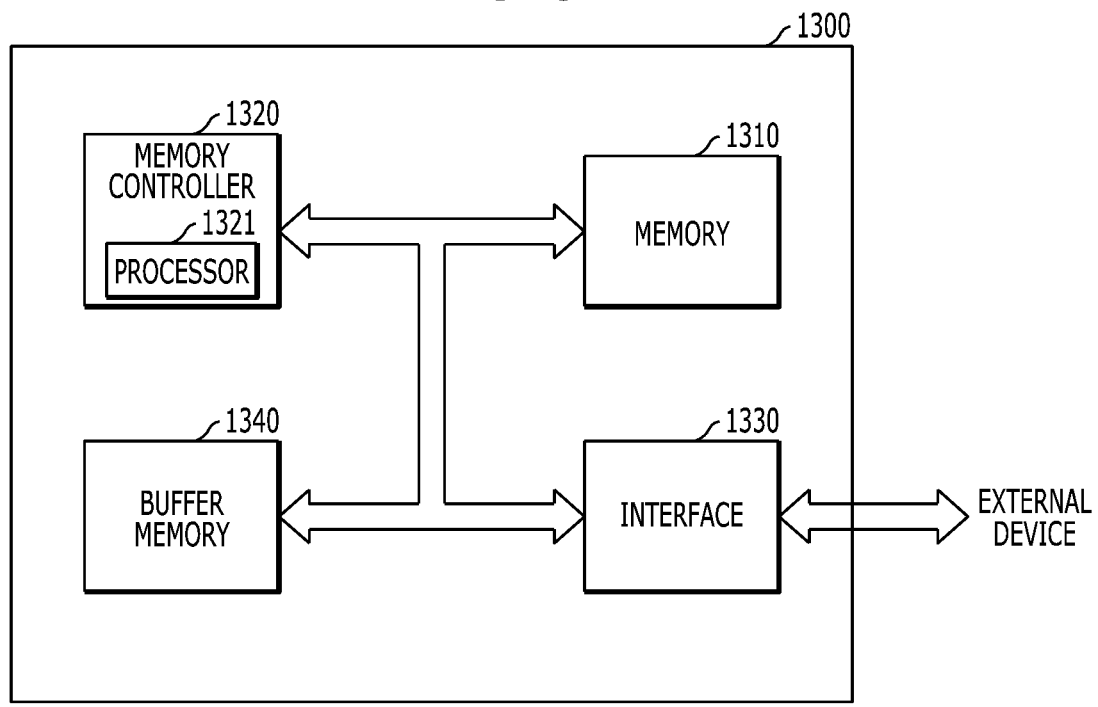
FIG. 8 illustrates an example configuration of a memory system that includes memory circuitry based on an implementation of the disclosed technology.

FIG. 8 illustrates an example configuration of a memory system that includes memory circuitry based on the disclosed technology.

Referring to FIG. 8, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the implementations. For example, the memory 1310 or the buffer memory 1340 may include a first electrode layer; a second electrode layer; and a selection element layer disposed between the first electrode layer and the second electrode layer to electrically couple or decouple and electrical connection between the first electrode layer and the second electrode layer based on a magnitude of an applied voltage or an applied current with respect to a threshold magnitude, wherein the selection element layer has a dopant concentration profile which decreases from an interface between the selection element layer and the first electrode layer toward an interface between the selection element layer and the second electrode layer. Through this, when forming the memory 1310 or the buffer memory 1340, the formation of an undesired interface layer can be suppressed, and/or the formed interface layer can be controlled, thereby effectively decreasing Vf, increasing a barrier height and effectively decreasing Ioff. As a consequence, it is possible to improve an electrical characteristic and an operational characteristic and secure reliability of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 5-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

Only a few implementations and examples are described. Other implementations, enhancements and variations can be made based on what is described and illustrated in this patent document.

What is claimed is:

1. A method for fabricating an electronic device comprising a semiconductor memory including a plurality of memory cells, the method comprising:
    forming a first electrode layer over a substrate in each memory cell;
    forming a selection element layer over the first electrode layer in each memory cell to turn on or off the memory cell;
    performing a first ion implantation process to implant a dopant into a resultant structure of each memory cell including the first electrode layer and the selection element on the substrate such that a projected range associated with a first ion implementation process corresponds to an interface between the first electrode layer and the selection element layer; and
    forming a second electrode layer over the selection element layer.

2. The method of claim 1, wherein the first ion implantation process is performed by using one or more of B, N, C, P, As, Al, Si or Ge as the dopant.

3. The method of claim 1, wherein the forming of the selection element layer includes:
    forming an interface layer including an oxide, a nitride or an oxynitride that includes a material included in the first electrode layer at an interface between the first electrode layer and the selection element layer; and
    removing at least a portion of the interface layer through the first ion implantation process.

4. The method of claim 1, further comprising forming a barrier layer interposed between the first electrode layer and the selection element layer.

5. The method of claim 4, wherein the barrier layer has a thickness ranging from 5 to 25 Å, and includes one or more materials selected from the group consisting of silicon, an oxide, a nitride and an oxynitride.

6. The method of claim 4, wherein, when forming the selection element layer, the barrier layer suppresses formation of an interface layer which includes an oxide, a nitride or an oxynitride containing a material included in the first electrode layer and is formed at an interface between the first electrode layer and the selection element layer.

7. The method of claim 1, wherein the forming of the selection element layer includes:
    depositing a material layer including one or more materials selected from the group consisting of a silicon oxide, a silicon nitride, a metal oxide and a metal nitride; and
    doping the material layer with dopants by a second ion implantation process.

8. The method of claim 7, wherein the dopants include one or more of B, N, C, P, As, Al, Si or Ge.

9. The method of claim 7, wherein the dopant used in the first ion implantation process and the dopant used in the second ion implantation process are the same as each other.

10. The method of claim 7, wherein the dopant used in the first ion implantation process and the dopant used in the second ion implantation process are different from each other.

11. The method of claim 7, wherein the first ion implantation process is performed with a higher energy than that of the second ion implantation process.

12. The method of claim 1, further comprising:
    forming a plurality of first interconnect lines over the substrate, each first interconnect line extending in a first direction; and
    forming a plurality of second interconnect lines over the memory cells, each second interconnect line extending in a second direction that crosses the first direction,
    wherein the memory cells are disposed at respective intersections of the plurality of first interconnect lines and the plurality of second interconnect lines.

* * * * *